United States Patent
Han

(10) Patent No.: US 7,208,374 B2
(45) Date of Patent: Apr. 24, 2007

(54) METHOD FOR MANUFACTURING A NON-VOLATILE MEMORY DEVICE

(75) Inventor: Il-Seok Han, Kyunggi-Do (KR)

(73) Assignee: Magnachip Semiconductor Ltd., Chungcheongbuk-do (KR)

( * ) Notice: Subject to any disclaimer, the term of this patent is extended or adjusted under 35 U.S.C. 154(b) by 0 days.

(21) Appl. No.: 10/983,443

(22) Filed: Nov. 8, 2004

(65) Prior Publication Data

US 2005/0142755 A1 Jun. 30, 2005

(30) Foreign Application Priority Data

Dec. 24, 2003 (KR) .................. 10-2003-0096911

(51) Int. Cl.
*H01L 21/336* (2006.01)
(52) U.S. Cl. .................. 438/258; 438/149; 438/200; 438/201

(58) Field of Classification Search .............. 438/149, 438/258, 201, 200
See application file for complete search history.

(56) References Cited

U.S. PATENT DOCUMENTS

| 5,134,583 | A | 7/1992 | Matsuo et al. |
| 5,550,072 | A * | 8/1996 | Cacharelis et al. ......... 438/201 |
| 5,898,616 | A | 4/1999 | Ono |
| 6,376,312 | B1 * | 4/2002 | Yu .............................. 438/268 |

* cited by examiner

*Primary Examiner*—Doug Menz
(74) *Attorney, Agent, or Firm*—Marshall, Gerstein & Borun LLP

(57) ABSTRACT

An EEPROM device manufacturing method is disclosed. The method includes the steps of oxidation, polysilicon deposition, and etching to form first polysilicon layers of a select transistor and a floating gate electrode. The method also includes a second polysilicon deposition step followed by an etching step to form a logic gate electrode and a control gate electrode at the same time. This method prevents damage to the silicon substrate and reduces the number of process steps compared to conventional manufacturing methods.

7 Claims, 8 Drawing Sheets

METHOD FOR MANUFACTURING A NON-VOLATILE MEMORY DEVICE

BACKGROUND OF THE INVENTION

1. Field of the Invention

The present invention relates to a method for manufacturing a nonvolatile memory device, and more particularly, to a method for manufacturing a nonvolatile memory device which can prevent damage to a silicon substrate and reduce a number of process steps by forming a logic gate electrode and cell control gate electrode at the same time instead of an SAE etching process.

2. Description of the Related Art

Nonvolatile memory devices are a type of semiconductor memory that can preserve stored data even if its power supply is interrupted. Of these nonvolatile memory devices, an EEPROM (electrically erasable and programmable read only memory is a nonvolatile memory device capable of stable storage even if there is no power supply, and also is a modified erasable and programmable read only memory (EPROM) having the characteristic of electrically erasing stored data and rewriting the same. Thus, the EEPROM can be used conveniently in various applications requiring program rewriting.

The EEPROM can write and erase data by electrically changing the charge of a device constituting a chip, and can reprogram data in a state stored in the system since it is capable of electrical reading and writing. In the EEPROM, a programming operation is enabled by generating channel hot electrons at a drain side, accumulating the electrons in a floating gate electrode and increasing the threshold voltage of a cell transistor, and an erasing operation is enabled by generating a high voltage between a source/substrate and the floating gate electrode, emitting the electrons accumulated in the floating gate electrode and decreasing the threshold voltage of the cell transistor.

In order to have the EEPROM cell to do the write/erase operations of byte (8 bits) unit, it is necessary that a unit cell have one select transistor. The select transistor used is defined simultaneously with the floating gate electrode of an EEPROM cell utilizing a first polysilicon.

Of the EEPROM, a device having a small chip size and having excellent write and erase characteristics includes a flash memory. In case of a flash cell, the flash cell has no select gate, thus it is capable of only block or chip unit erasing. A floating gate electrode defined as a first polysilicon is etched on a field oxide film. Thus, after the deposition of a second polysilicon, the loss of the field oxide film occurs even if the first polysilicon and the second polysilicon are stacked and etched, thereby causing no damage on the silicon substrate.

On the other hand, in case of the EEPROM cell, the select transistor using the first polysilicon and the floating gate electrode of the EEPROM cell are formed in an active region unlike a flash memory. Thus, the active region is opened where no first polysilicon exists in the self align etch (SAE) process of the first polysilicon and the second polysilicon. Due to this, the damage of the active open region by the over-etching of silicon occurs as much as the first polysilicon etching target.

Hereinafter, the problems of the method for manufacturing a nonvolatile memory device according to the conventional art will be described with reference to the accompanying drawings.

FIG. 1 is a sectional view showing an EEPROM device and a logic device formed according to the conventional art.

As shown in FIG. 1, a select transistor 110 formed on the silicon substrate 100, a first polysilicon 121 acting as a floating gate electrode and a second polysilicon 122 acting as a control gate electrode are formed in an EEPROM device region A. Further, a second polysilicon 122' acting as a logic gate electrode 130 is formed in a logic device region B that is to be formed on the same wafer as the EEPROM device region, thus the logic gate electrode has the same transistor characteristics as a general analog logic device.

FIG. 2 is a plane view showing an EEPROM device and a logic device formed according to the conventional art. An active damage occurs in the process of stacking and etching an EEPROM cell in a C region, and the damage occurred in the active region during the etching process leads to a leakage current. Due to this, a stand-by current is increased, thereby generating a junction leakage current in the drain active side where a contact is to be formed.

FIGS. 3a to 3j are sectional views showing sequential processes for manufacturing a nonvolatile memory device according to the conventional art.

Firstly, as shown in FIG. 3a, a field oxide film 310 is formed on a silicon substrate 300 by a LOCOS method for device isolation, to thus isolate a logic region and an EEPROM cell region. And, a deep N-well and P-well ion implantation are carried out.

Continually, as shown in FIG. 3b, a channel ion implantation of the select transistor and an ion 320 implantation for controlling the threshold voltage of the EEPROM cell are carried out.

Then, as shown in FIG. 3c, a dual gate oxidization process for forming a gate oxide film 330 of the select transistor and a tunnel oxide film 330' of the EEPROM cell is performed.

Then, a first polysilicon is deposited and a selective photograph and etching process is performed to thus form a gate electrode 340 and a floating gate electrode 340' of EEPROM cell as shown in FIG. 3d. The first polysilicon is formed in the active region except the field oxide film 310.

Afterwards, as shown in FIG. 3e, in order to insulate the floating gate electrode 340' of the EEPROM cell and a second polysilicon to be deposited hereinafter, an Oxide-Nitride-Oxide ("ONO") film 350 is formed on the entire surface of a wafer, and a selective photograph and etching process is performed to completely cover the floating gate electrode 340'.

Then, as shown in FIG. 3f, an ion implantation process for controlling the threshold voltage is performed to a logic device region B and a logic gate oxide film 360 is formed.

Continually, as shown in FIG. 3g, a second polysilicon 370 that is to be used as a control gate electrode of the EEPROM cell and as a gate of the logic device is deposited. Then, as shown in FIG. 3h, the logic device region B is blocked, and the second the polysilicon 370' of the EEPROM cell region undergoes an SAE (self align etch) process.

Next, as shown in FIG. 3i, the SAE process is, completed to make the first polysilicon/second polysilicon of the EEPROM cell region have a stacked shape. At this time, although there is no problem in the portion where the first polysilicon 340' exists at the lower end of the second polysilicon 370', the silicon substrate is exposed at the portion where the first polysilicon 340' does not exist at the lower end of the second polysilicon 370. Thus, in the SAE process, the silicon substrate is damaged as much as an etching target for etching the ONO film 350 and the first polysilicon 340' after the second polysilicon etching process. Also, more serious damage occurs in the active region of a D portion where no ONO film 350 exists, thereby giving rise to a leakage current of the EEPROM cell.

Thereafter, as shown in FIG. 3j, the EEPROM cell region A is blocked by photoresist and then the second polysilicon 370 of the logic region is selectively etched to form a logic gate electrode 370".

According to the method for manufacturing a nonvolatile memory device according to the conventional art, upon the SAE process for the process of forming a gate of a stacked shape of the first polysilicon/second polysilicon in the EEPROM cell, the silicon substrate of the active region at the portion having no first polysilicon, particularly, at the portion having no ONO film, thus giving rise to a leakage current. As a result, there occurs a problem that the standby current is increased to give rise to a leakage current in the drain active side.

SUMMARY OF THE INVENTION

The present invention is designed in consideration of the problems of the prior art, and therefore it is an object of the present invention to provide a method for manufacturing a nonvolatile memory device, and more particularly, to a method for manufacturing a nonvolatile memory device which can prevent damage to a silicon substrate and reduce the number of process steps by etching a floating gate electrode at the same size as a conventionally finally formed floating gate electrode, covering the overall floating gate electrode with an ONO film and etching a control gate electrode of an EEPROM cell and a logic gate electrode under the same conditions as a logic gate etching.

To achieve the above object, there is provided a method for manufacturing a nonvolatile memory device according to the present invention, comprising the steps of: forming a gate oxide film of a select transistor and a tunnel oxide film of an EEPROM cell on a semiconductor substrate where a cell region and a logic region are isolated and a predetermined substructure is formed; depositing a first polysilicon on the resultant material where the gate oxide film of the select transistor and the tunnel oxide film are formed; forming a gate electrode of the select transistor and a floating gate electrode of the EEPROM cell by selectively etching the first polysilicon; forming an ONO film so as to cover the floating gate electrode; carrying out a threshold voltage control ion implantation to the logic region and forming a logic gate oxide film; and forming a logic gate electrode and a control gate electrode of the EEPROM cell at the same time by depositing a second polysilicon on the entire surface of the resultant material and etching the second polysilicon.

In the method for manufacturing a nonvolatile memory device according to the present invention, it is possible to prevent damage to an active region by forming a floating gate electrode having the same length as the channel length upon the process of selectively etching the first polysilicon and additionally etching the first polysilicon upon a subsequent control gate electrode etching process.

In the method for manufacturing a nonvolatile memory device according to the present invention, it is possible to improve the insulating properties by overlapping 0.2 to 0.3 μm of the floating gate electrode with an ONO film and completely covering the same.

BRIEF DESCRIPTION OF THE DRAWINGS

Other objects and aspects of the present invention will become apparent from the following description of embodiments with reference to the accompanying drawings in which.

DESCRIPTION OF THE PREFERRED EMBODIMENT

Figure 1:
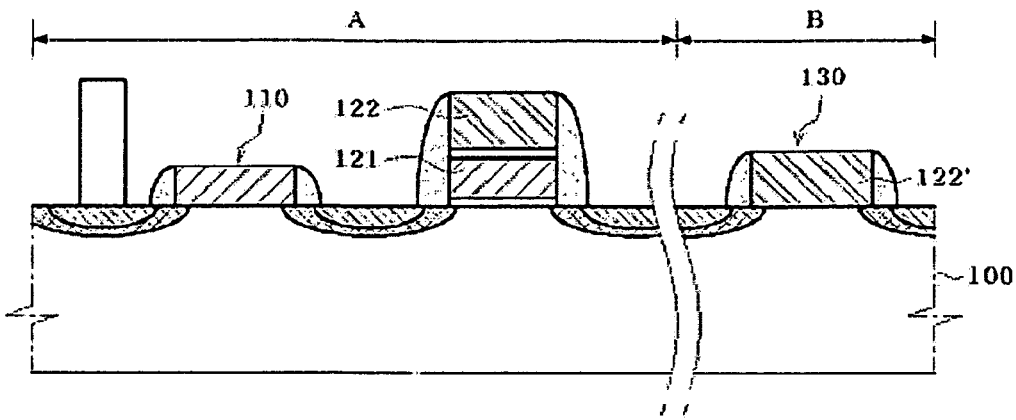
FIG. 1 is a sectional view showing an EEPROM device and a logic device formed according to the conventional art.
Figure 2:
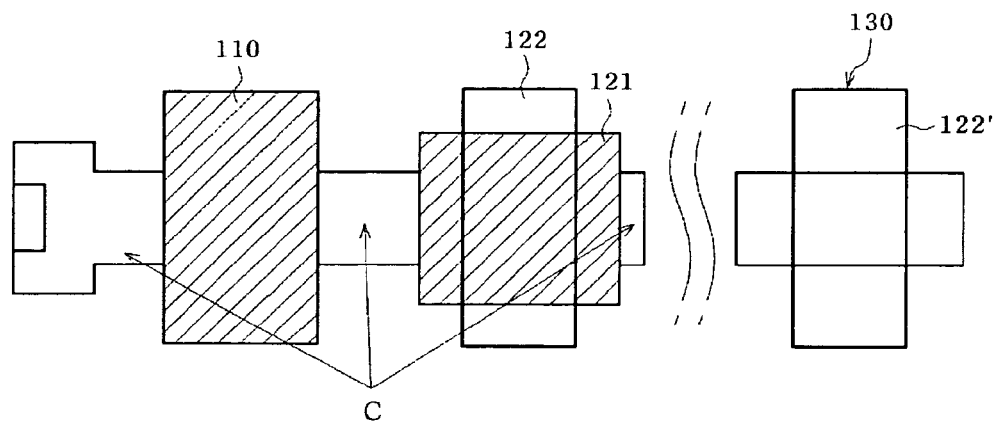
FIG. 2 is a plane view showing an EEPROM device and a logic device formed according to the conventional art.
Figure 3A:
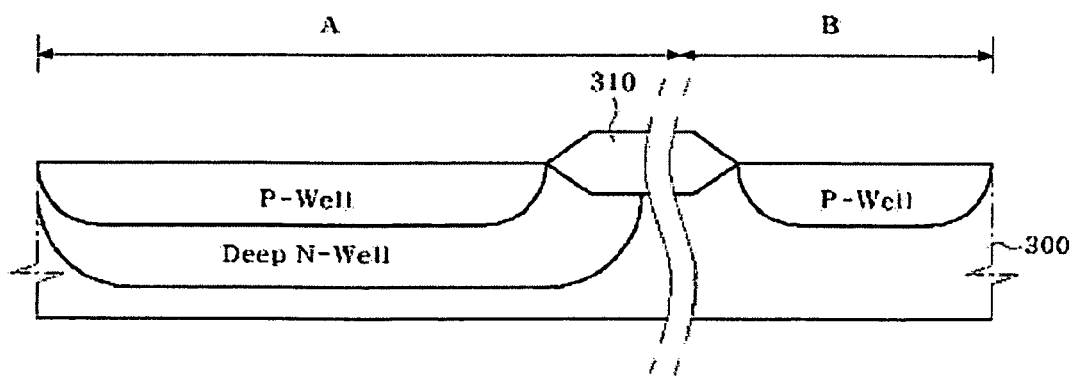
FIGS. 3a to 3j are sectional views showing processes for manufacturing a nonvolatile memory device according to the conventional art.
Figure 3B:
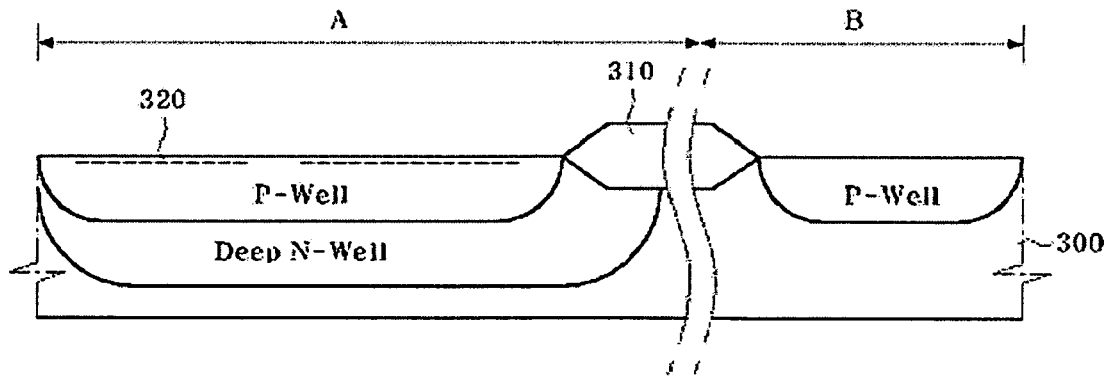
Figure 3C:
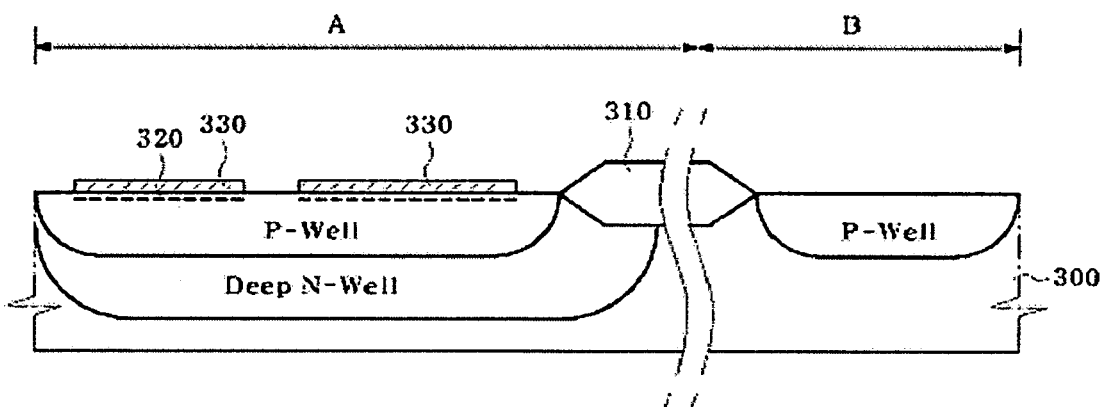
Figure 3D:
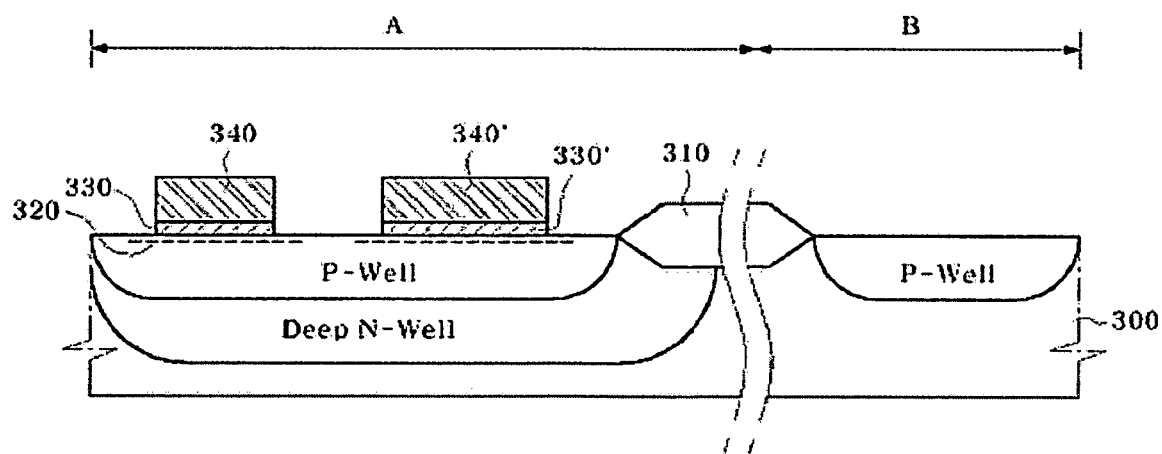
Figure 3E:
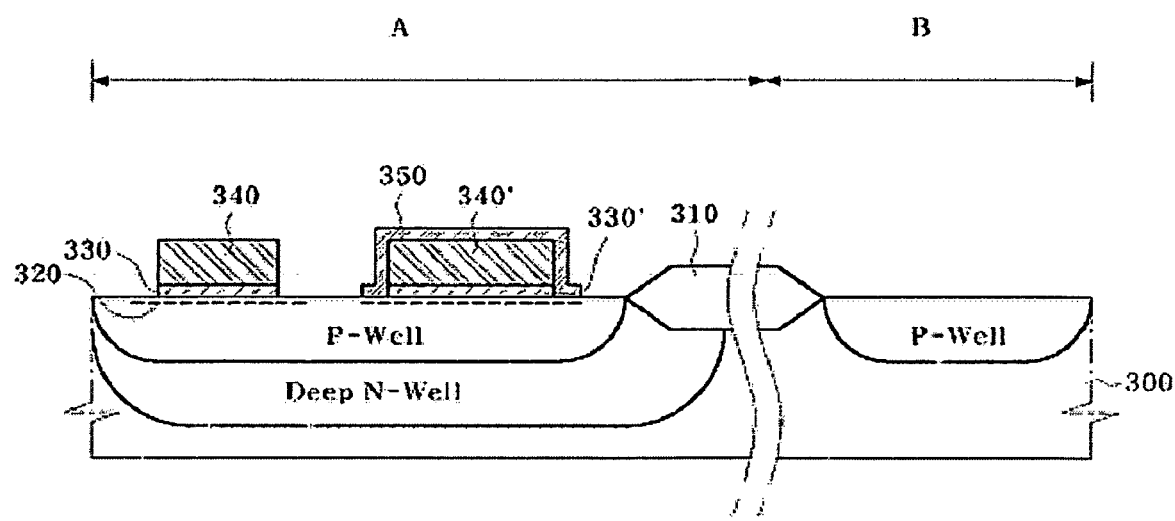
Figure 3F:
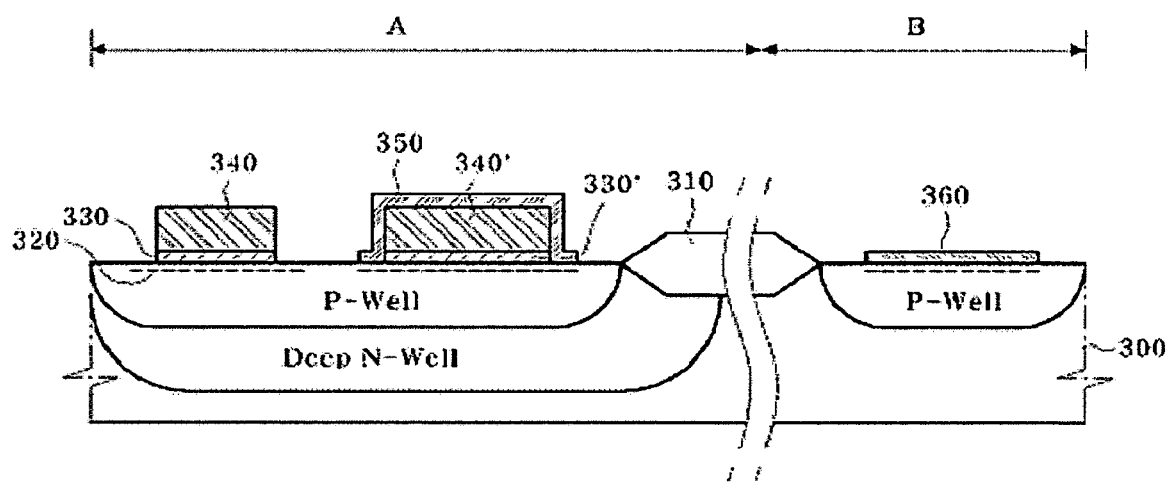
Figure 3G:
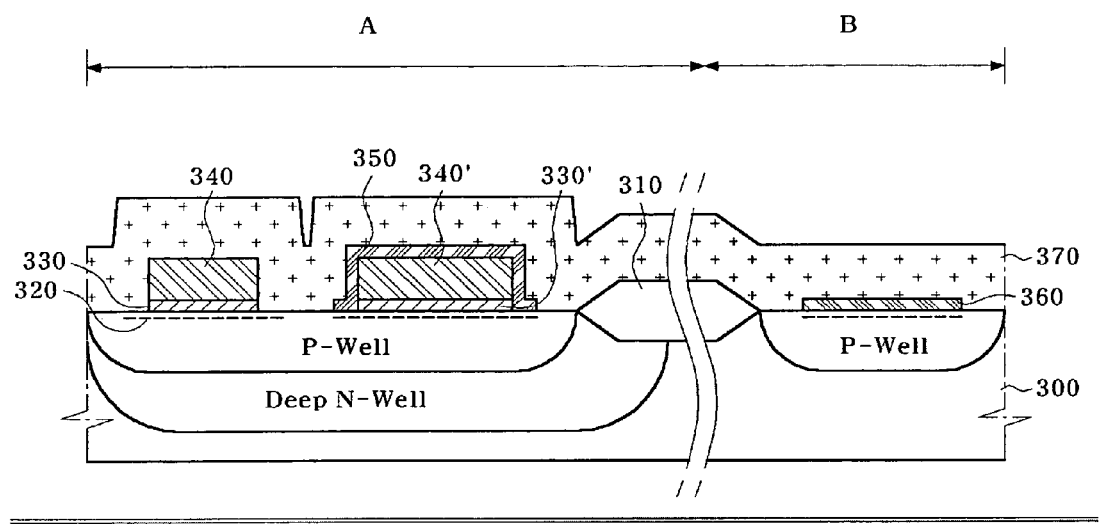
Figure 3H:
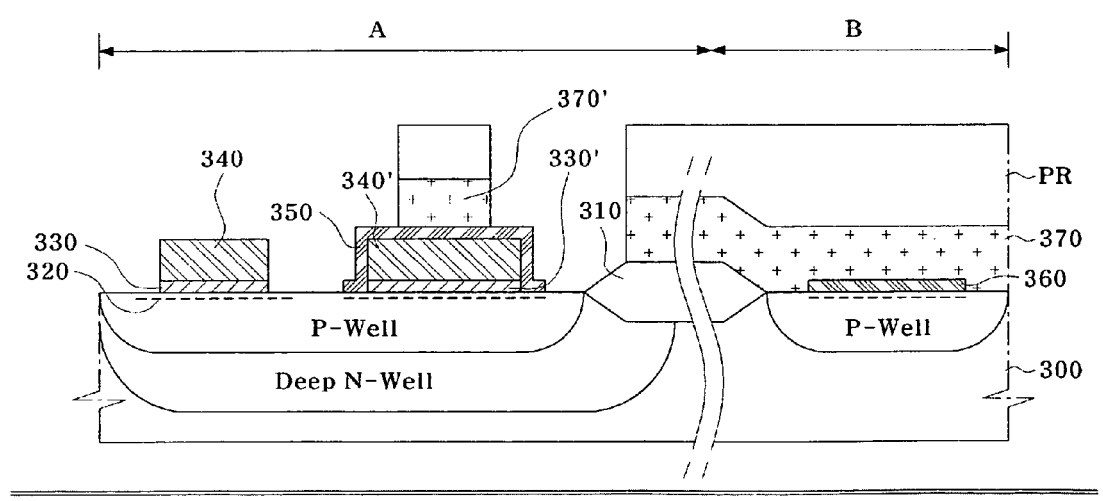
Figure 3I:
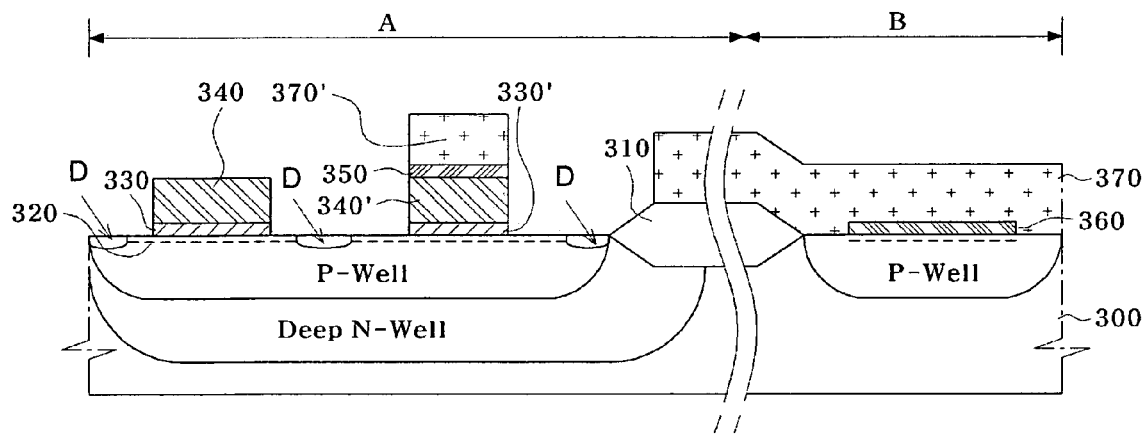
Figure 3J:
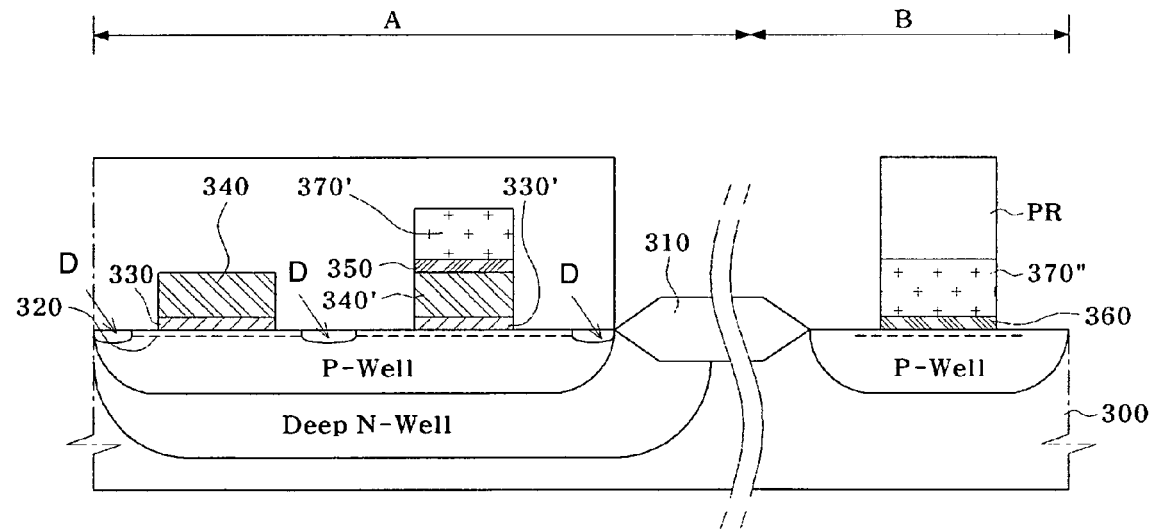

Hereinafter, a preferred embodiment of the present invention will be described in more detail referring to the drawings. In addition, the following embodiment is just for illustration only, not intended to limit the scope of the invention, and the identical component to the conventional art uses the identical reference numeral and name.

FIGS. 4a to 4i are sectional views showing processes for manufacturing a nonvolatile memory device according to the present invention sequentially.

Figure 4A:
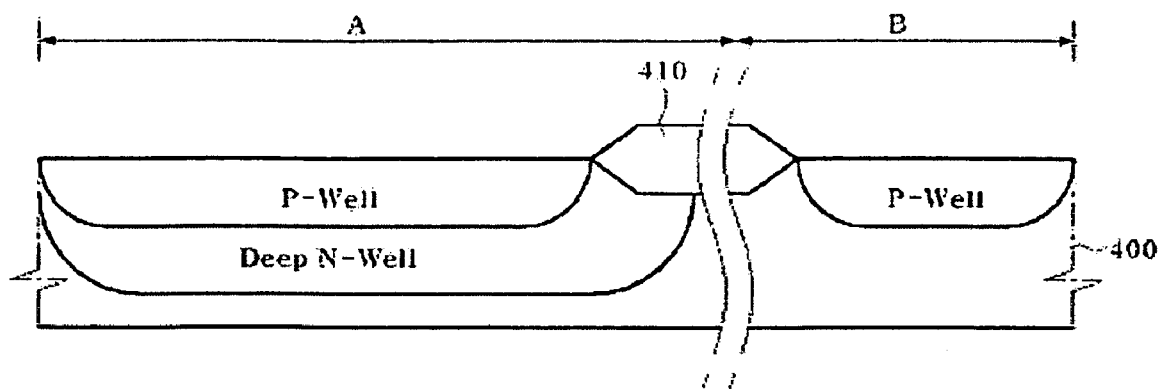
FIGS. 4a to 4i are sectional views showing processes for manufacturing a nonvolatile memory device according to the present invention.

Firstly, as shown in FIG. 4a, a field oxide film 410 is formed on a silicon substrate 400 by a LOCOS method for device isolation, to thus isolate a logic region and an EEPROM cell region. And, a deep N-well and P-well ion implantation is carried out.

Figure 4B:
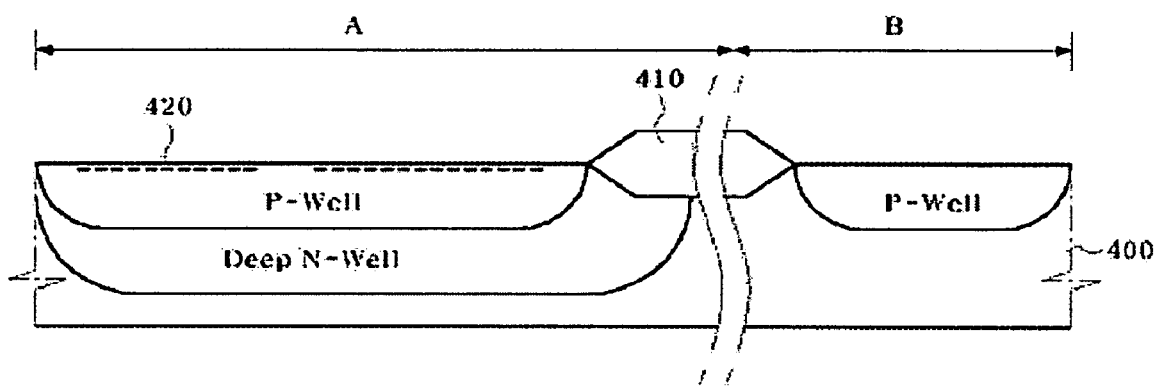

Continually, as shown in FIG. 4b, a channel ion implantation of the select transistor and an ion 420 implantation for controlling the threshold voltage of the EEPROM cell are carried out.

Figure 4C:
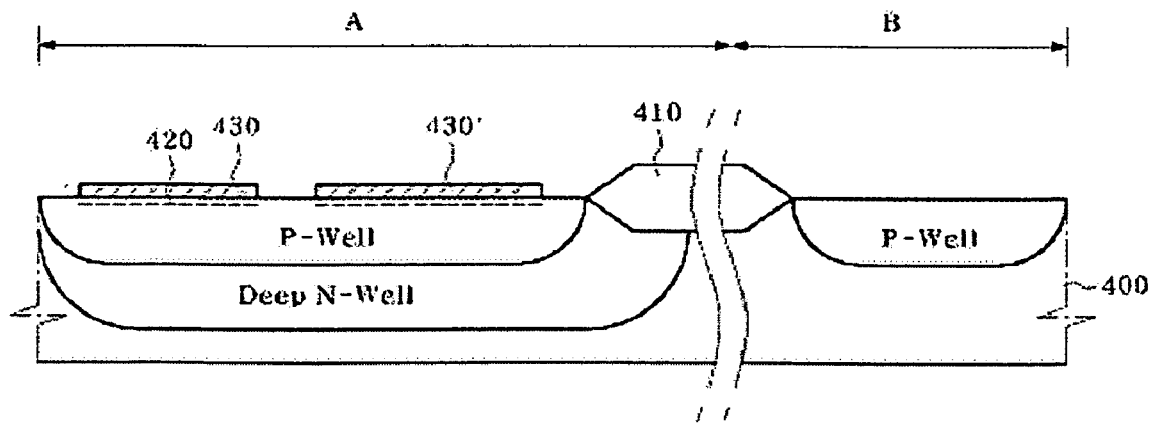
Figure 4D:
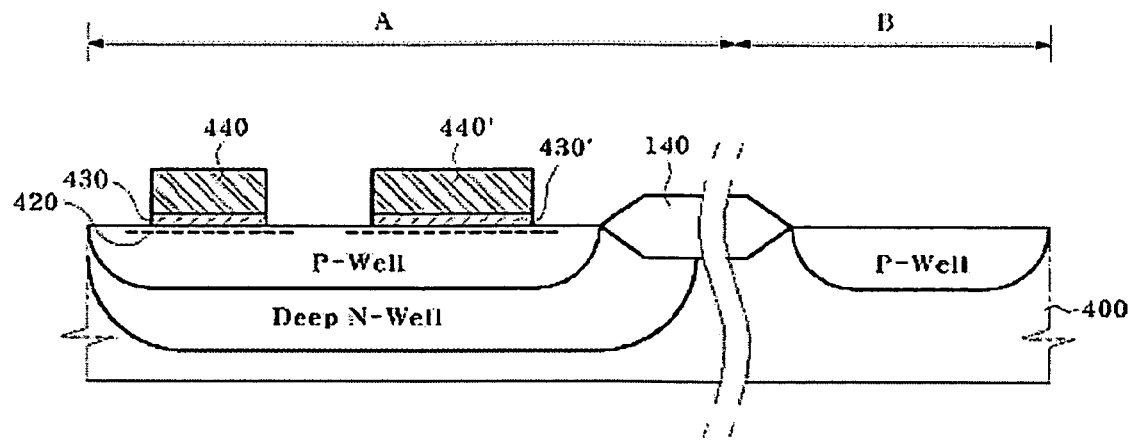

Then, as shown in FIG. 4c, a dual gate oxidization process for forming a gate oxide film 430 of the select transistor and a tunnel oxide film 430' of the EEPROM cell is performed. At this time, the gate oxide film 430 of the select transistor is oxidized to have a thickness of 150 to 250 Å in consideration of the transistor margin for a high voltage, and then only a tunnel oxide film forming region is sheeted off in order to form a tunnel oxide film of the EEPROM cell to thus form a tunnel oxide film at a thickness of 85 to 95 Å by a reoxidization process. Then, a first polysilicon is deposited and a selective photograph and etching process is performed to thus form a gate electrode 440 and a floating gate electrode 440' of an EEPROM cell. At this time, the gate electrode 440 serves to transfer a high voltage of the lower end of a drain to the EEPROM cell, and the floating gate electrode 440' serves to implant or emit electrons upon a FN tunneling to thus make a cell threshold voltage in a desired write/erase state.

Additionally, the channel length of the floating gate electrode 440' is made the same as the channel length of the first polysilicon of a stack cell conventionally finally formed by a SAE process. That is, the channel length is etched so as to be 0.2 to 0.6 μm smaller than the length of a conventional first polysilicon after the etching of the first polysilicon.

Figure 4E:
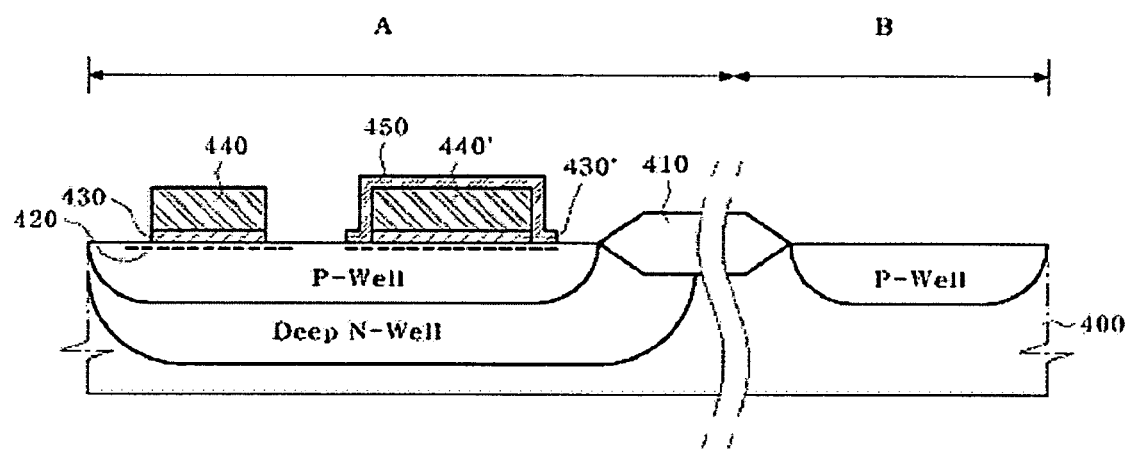

Afterwards, as shown in FIG. 4e, in order to insulate the floating gate electrode 440' of the EEPROM cell and a second polysilicon to be deposited hereinafter, an ONO film 450 is formed on the entire surfaces of a wafer, and a selective photograph and etching process is performed to overlap 0.2 to 0.3 μm of the floating gate electrode 440' and completely cover it.

Figure 4F:
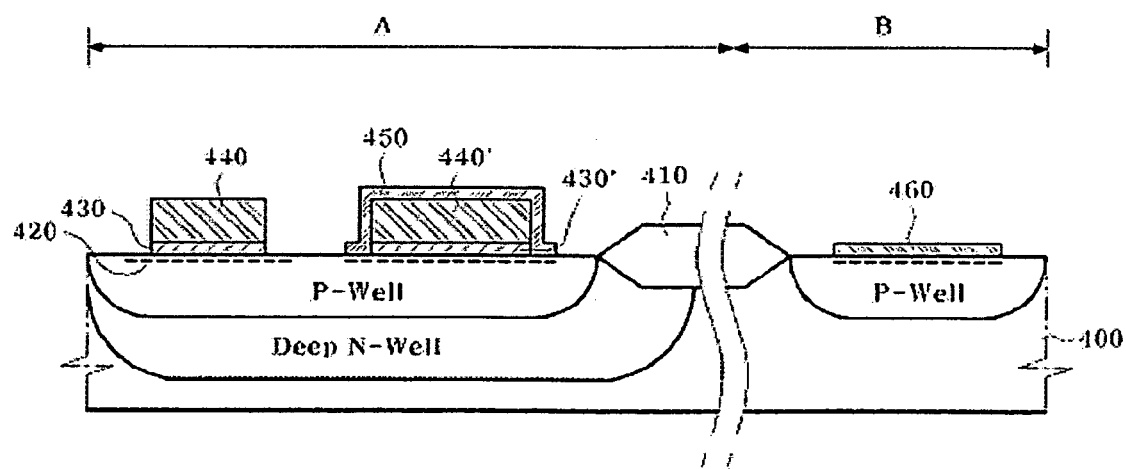

Then, as shown in FIG. 4f, an ion implantation process for controlling the threshold voltage is performed to a logic device region B and a logic gate oxide film 460 is formed.

Figure 4G:
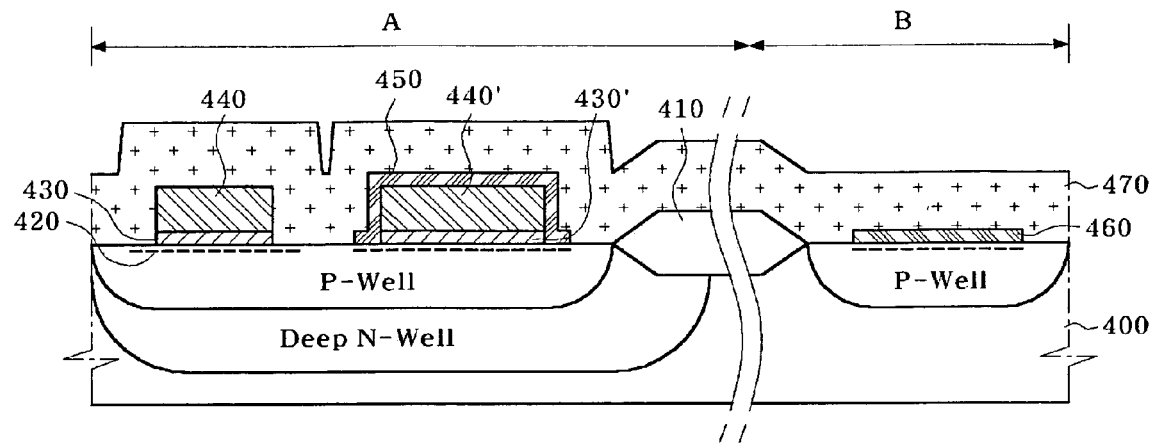
Figure 4H:
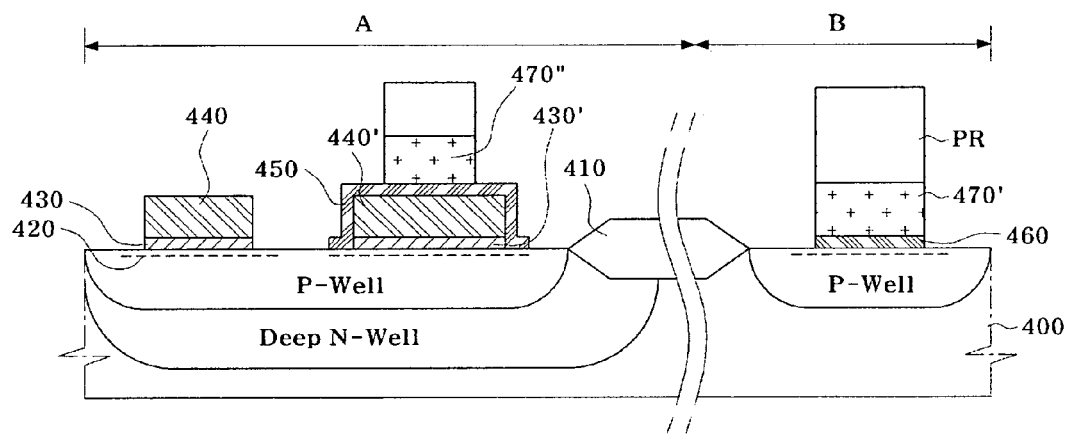

Continually, as shown in FIG. 4g, a second polysilicon 470 that is to be used as a control gate electrode of the EEPROM cell and a gate of the logic device is deposited. Then, as shown in FIG. 4h, the logic device region B and the second polysilicon 470 of the EEPROM cell region are etched. The second polysilicon etching process for both of the logic region and the EEPROM cell region, is carried out in the same manner as the logic gate etching method so that the logic gate electrode 470' and the control gate electrode 470" of the EEPROM cell can be formed at the same time. At this time, the EEPROM cell control gate electrode 470" having the same thickness as the logic gate electrode 470' is formed. Thereafter, no additional etching process is performed, thus the number of process steps can be reduced. Besides, no damage is applied to the silicon substrate, thus preventing generation of a leakage current.

Figure 4I:
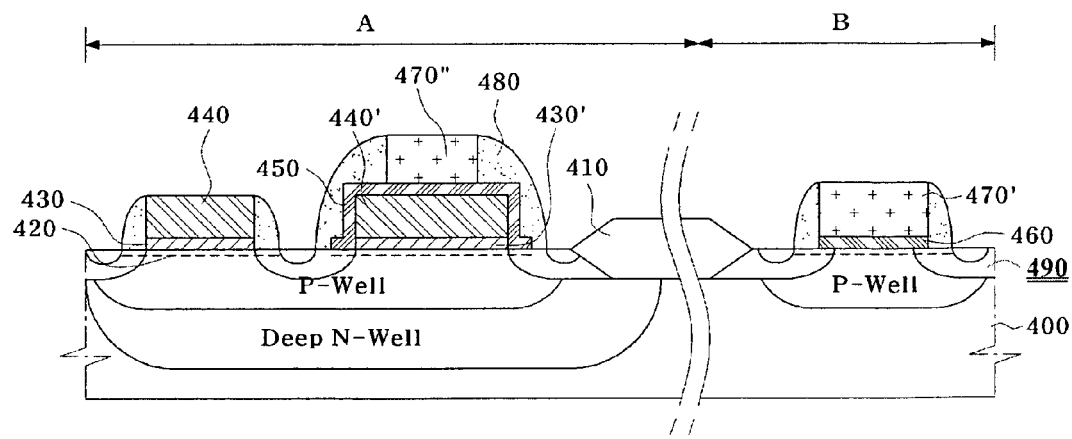

Then, as shown in FIG. 4i, a spacer 480 is formed on the side walls of the gate electrode 440, the EEPROM cell stack gate (first polysilicon/second polysilicon) and the logic gate electrode, and then a selective photograph and ion implantation process is performed to form a source/drain junction region 490.

In this way, according to the method for manufacturing a nonvolatile memory device according to the present invention, upon a floating gate electrode etching process, the first polysilicon is etched so as to be the same as a conventionally formed floating gate electrode, that is, so as to be 0.2 to 0.6 µm smaller as compared to a conventional floating gate electrode etching process, then the floating gate electrode is covered with an ONO film and then the control gate electrode of the EEPROM cell and the logic gate electrode are etched at the same time under the same condition as a logic gate etching. Therefore, it is possible to overcome the problem that, in a conventional SAE process, the silicon substrate at the portion where the first polysilicon does not exist is damaged. Moreover, a number of photograph and etching process steps can be reduced.

As seen from above, the present invention is advantageous in that, in the process of selectively etching the second polysilicon, the logic gate electrode and the control gate electrode of the EEPROM cell are etched at the same time under the same condition as a logic gate etching, thus requiring no additional etching process and reducing the number of process steps.

Furthermore, upon etching the floating gate electrode of the EEPROM cell, the floating gate electrode is etched to have the same length as the channel length, and then the etching process for the first polysilicon is not performed upon the second polysilicon etching process. Thus, the active region of the silicon substrate is not damaged to thus prevent generation of an initial current and a leakage current.

What is claimed is:

1. A method for manufacturing a nonvolatile memory device, comprising the steps of:

forming a gate oxide film of a select transistor and a tunnel oxide film of an Electrically Erasable and Programmable Read Only Memory ("EEPROM") cell on a semiconductor substrate where a cell region and a logic region are isolated and a predetermined substructure is formed;

depositing a first polysilicon on the resultant material where the gate oxide film of the select transistor and the tunnel oxide film of the EEPROM cell are formed;

forming a gate electrode of the select transistor and a floating gate electrode of the EEPROM cell by selectively etching the first polysilicon, wherein the floating gate electrode formed by the selective etching has a channel length that is the same as a channel length of a first polysilicon in a stack cell formed by a combined selective etching and Self-Aligned Etch process;

forming an Oxide-Nitride-Oxide ("ONO") film so as to cover the floating gate electrode;

carrying out a threshold voltage control ion implantation to the logic region and forming a logic gate oxide film; and forming a logic gate electrode and a control gate electrode of the EEPROM cell at the same time by depositing a second polysilicon on the entire surface of the resultant material and etching the second polysilicon.

2. The method of claim 1, comprising overlapping and completely covering 0.2 to 0.3 µm of the floating gate electrode with an ONO film.

3. The method of claim 1, comprising etching the control gate electrode so as to be 0.1 to 0.2 µm smaller than the floating gate electrode.

4. A method for manufacturing a nonvolatile memory device, comprising the steps of:

forming a gate oxide film of a select transistor and a tunnel oxide film of an Electrically Erasable and Programmable Read Only Memory ("EEPROM") cell on a semiconductor substrate where a cell region and a logic region are isolated and a predetermined substructure is formed;

depositing a first polysilicon on the resultant material where the gate oxide film of the select transistor and the tunnel oxide film of the EEPROM cell are formed;

forming a gate electrode of the select transistor and a floating gate electrode of the EEPROM cell by selectively etching the first polysilicon;

forming an Oxide-Nitride-Oxide ("ONO") film so as to cover the floating gate electrode;

carrying out a threshold voltage control ion implantation to the logic region and forming a logic gate oxide film; and forming a logic gate electrode and a control gate electrode of the EEPROM cell at the same time by depositing a second polysilicon on the entire surface of the resultant material and etching the second polysilicon, without subsequently etching the ONO film.

5. The method of claim 4, wherein the floating gate electrode formed by the selective etching has a channel length that is the same as a channel length of a first polysilicon in a stack cell formed by a combined selective etching and Self-Aligned Etch process.

6. The method of claim 4, comprising overlapping and completely covering 0.2 to 0.3 µm of the floating gate electrode with an ONO film.

7. The method of claim 4, comprising etching the control gate electrode so as to be 0.1 to 0.2 µm smaller than the floating gate electrode.

* * * * *